United States Patent
Tachi et al.

(10) Patent No.: US 6,680,658 B2
(45) Date of Patent: Jan. 20, 2004

(54) MODULATION CIRCUIT FOR WIRELESS INSTALLATION

(75) Inventors: Satoshi Tachi, Singapore Science Park II (SG); Masaaki Itoh, Singapore Science Park II (SG); Poh Boon Leong, Singapore Science Park II (SG)

(73) Assignee: Oki Techno Centre (Singapore) Pte Ltd. (SG)

( * ) Notice: Subject to any disclaimer, the term of this patent is extended or adjusted under 35 U.S.C. 154(b) by 9 days.

(21) Appl. No.: 10/193,895

(22) Filed: Jul. 15, 2002

(65) Prior Publication Data

US 2003/0169120 A1 Sep. 11, 2003

(30) Foreign Application Priority Data

Mar. 6, 2002 (SG) .......................................... 200201337

(51) Int. Cl.$^7$ ................................................ H03C 3/02
(52) U.S. Cl. ...................................... 332/123; 332/159
(58) Field of Search ................................. 332/149, 159, 332/162, 117, 118, 107, 123

(56) References Cited

U.S. PATENT DOCUMENTS 4,450,481 A * 5/1984 Dickinson .................... 380/209
5,432,815 A * 7/1995 Kang et al. ................. 375/145
6,052,037 A * 4/2000 Kaku et al. .................. 332/100
6,515,540 B1 * 2/2003 Prasad et al. ................... 330/9

* cited by examiner

Primary Examiner—Timothy P. Callahan
Assistant Examiner—Cassandra Cox
(74) Attorney, Agent, or Firm—Venable LLP; Michael A. Sartori

(57) ABSTRACT

A modulation circuit includes a band restriction filter 2, an attenuator 3, a modulator 4, a reference voltage generator 8, a comparing reference voltage generator 9, a voltage comparator 10 and an attenuator controller 7. The band restriction filter 2 receives modulation data. The attenuator 3 is connected to the band restriction filter 2 for adjusting its attenuation in response to an attenuator control signal. The reference voltage generator 8 is connected to the attenuator 3 for providing a reference voltage independent of a temperature and a power supply voltage to the attenuator. The comparing reference voltage generator 9 is connected to the reference voltage generator 8 for providing a comparing reference voltage independent of the temperature and the power supply voltage. The modulator 4 is connected to the attenuator 3. The voltage comparator 10 is connected to the attenuator 3 and the comparing reference voltage generator 9 for comparing the comparing reference voltage with a voltage of an output of the attenuator 3 and generating a comparison signal based on the comparison. The attenuator controller 7 is connected to the attenuator 3 and the voltage comparator 10 for generating the attenuator control signal in response to the comparison signal.

19 Claims, 6 Drawing Sheets

MODULATION CIRCUIT FOR WIRELESS INSTALLATION

BACKGROUND OF THE INVENTION

The present invention relates to a modulation circuit and particularly to a modulation circuit used in a digital modulation system for a wireless installation.

The conventional frequency modulation circuit has a band restriction filter and a modulator. Modulation data are send to the modulation circuit. The received modulation data are input into the band restriction filter. A band of the modulation data is restricted by the band restriction filter. The band restriction data are input to the modulator directly.

Amplitude of the band restriction data is changed according to a change of an ambient temperature and a power supply voltage. Further the modulator influences a modulation factor of the modulation circuit according to the ambient temperature change. Therefore, the conventional frequency modulation circuit would not keep a constant modulation factor.

SUMMARY OF THE INVENTION

The modulation circuit of the present invention may keep a constant modulation factor regardless of the change of the ambient temperature and the power supply voltage.

A modulation circuit of the present invention includes a band restriction filter, an attenuator, a modulator, a reference voltage generator, a comparing reference voltage generator, a voltage comparator and an attenuator controller. The band restriction filter receives modulation data. The attenuator is connected to the band restriction filter for adjusting its attenuation in response to an attenuator control signal. The reference voltage generator is connected to the attenuator for providing a reference voltage independent of a temperature and a power supply voltage to the attenuator. The comparing reference voltage generator is connected to the reference voltage generator for providing a comparing reference voltage independent of the temperature and the power supply voltage. The modulator is connected to the attenuator. The voltage comparator is connected to the attenuator and the comparing reference voltage generator for comparing the comparing reference voltage with a voltage of an output of the attenuator and generating a comparison signal based on the comparison. The attenuator controller is connected to the attenuator and the voltage comparator for generating the attenuator control signal in response to the comparison signal.

BRIEF DESCRIPTION OF THE DRAWINGS

While the specification concludes with claims particularly pointing out and distinctly claiming the subject matter which is regarded as the invention, it is believed that the invention, the objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described in detail with reference to the accompanying drawings.

Figure 1:
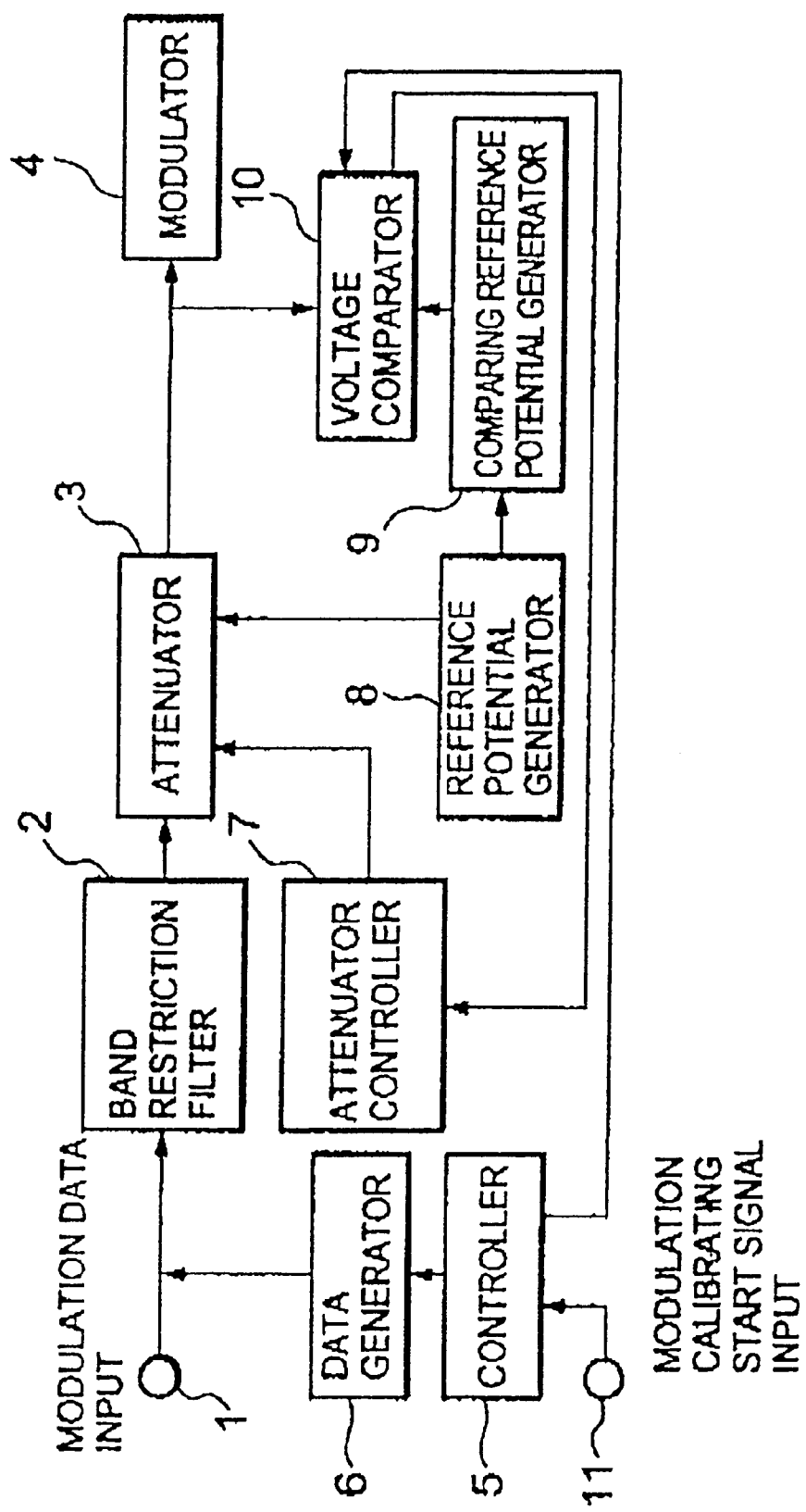
FIG. 1 is a block circuit diagram of a modulation circuit according to the first embodiment of the present invention.

FIG. 1 is a block circuit diagram of a modulation circuit according to the first embodiment of the present invention.

Modulation data sent from an outside of the modulator circuit are received at a modulation data input terminal 1. The received modulation data are send to a band restriction filter 2. A band of the modulation data is restricted by the band restriction filter 2. The band restriction data are sent to a modulator 4 through an attenuator 3. The attenuator 3 controls amplitude of attenuation in response to an attenuation control signal from an attenuator controller 7.

A reference potential generator 8 outputs a constant reference voltage regardless of a change of an ambient temperature and a power supply voltage. The reference potential generator 8 provides the constant reference voltage to the attenuator 3 and a comparing reference potential generator 9. The comparing reference potential generator 9 provides a constant comparing reference potential to a voltage comparator 10. There is a predetermined potential difference between the comparing reference potential and reference potential. The potential difference equals to an amplitude (a difference between a peak and a DC level) of an output signal of the attenuator 3 after a calibration as mentioned bellow.

The voltage comparator 10 compares a voltage of the comparing reference potential provided by the comparing reference potential generator 9 with a voltage of an input signal of the modulator 4. The voltage comparator 10 outputs a comparison signal to the attenuator controller 7.

A data generator 6 generates calibration data in response to a control signal output from a controller 5. The data generator 6 provides the calibration data to the band restriction filter 2. A modulation calibrating start signal input terminal 11 receives a modulation calibrating start signal. The controller is connected to the modulation calibrating start signal input terminal 11, the data generator 6 and the voltage comparator 10. The controller 5 controls operation timings of the data generator 6 and the voltage comparator 10 based on the modulation calibrating start signal from the modulation calibrating start signal input terminal 11.

Figure 2:
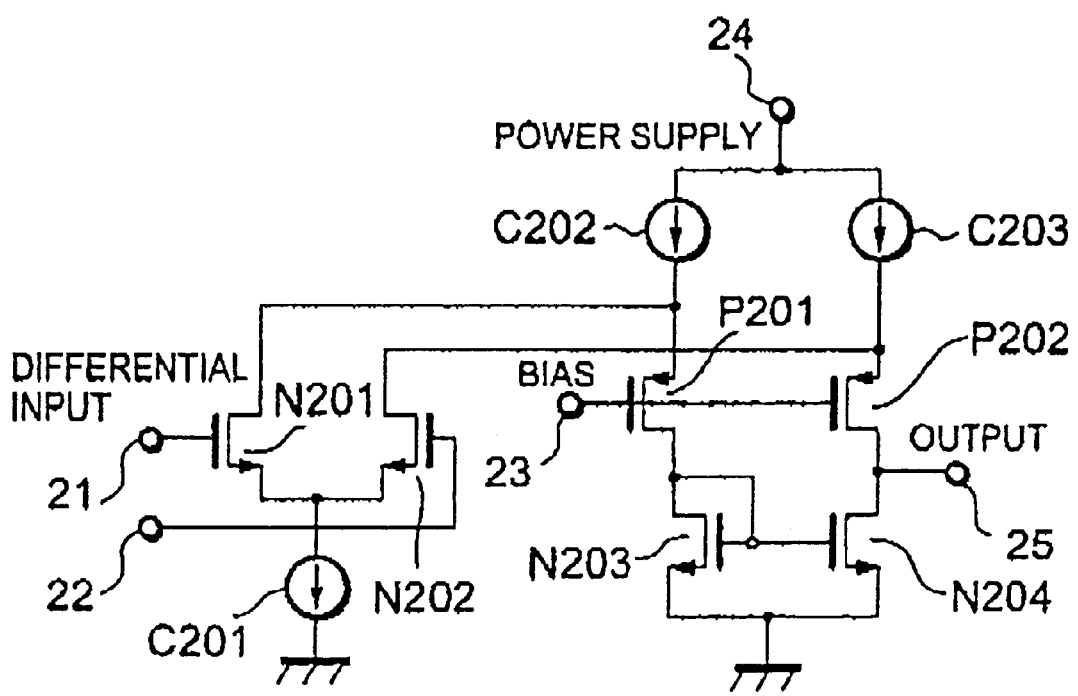
FIG. 2 is a circuit diagram of an output circuit of a band restriction filter shown in FIG. 1.

FIG. 2 is a circuit diagram of an output circuit of the band restriction filter 2. The output circuit is known as a folded cascode amplifier.

The output circuit includes three current sources C201, C202 and C203, four NMOS transistors N201, N202, N203 and N204, two PMOS transistors P201 and P202, a pair of differential input terminals 21 and 22, a bias terminal 23, a power supply terminal 24 and an output terminal 25. The differential input terminal 21 and 22 are connected to gates of the NMOS transistors N201 and N202, respectively. Drains of the NMOS transistors N201 and N202 are connected to an input of a current source C201. An output of the current source C201 is connected to ground.

Inputs of current sources C202 and C203 are connected to the power supply terminal 24. An output of the current source C202 is connected to a drain of the NMOS transistor N201 and a source of a PMOS transistor P201. An output of the current source C203 is connected to a drain of the NMOS transistor N202 and a source of a PMOS transistor P202. Gates of the PMOS transistors P201 and P202 are connected to the bias terminal 23. A drain of the PMOS transistor P201 is connected to gates of the NMOS transistors N203 and N204 and a drain of the NMOS transistor N203. A drain of the PMOS transistor P202 and a drain of the NMOS transistor N204 are connected to the output terminal 25. Source of the NMOS transistors N203 and N204 are connected to ground.

The differential signal input terminals receive differential output signals output from a filter (not shown). The output circuit converts the differential signals into a single-ended signal. The single-ended signal is output from the output terminal 25. The output terminal 25 is connected to an input of the attenuator 3. A power supply voltage is applied to the power supply terminal 24. The bias terminal receives a bias signal. A gain of the output circuit (folded cascode amplifier) is determined by the bias signal.

Figure 3:
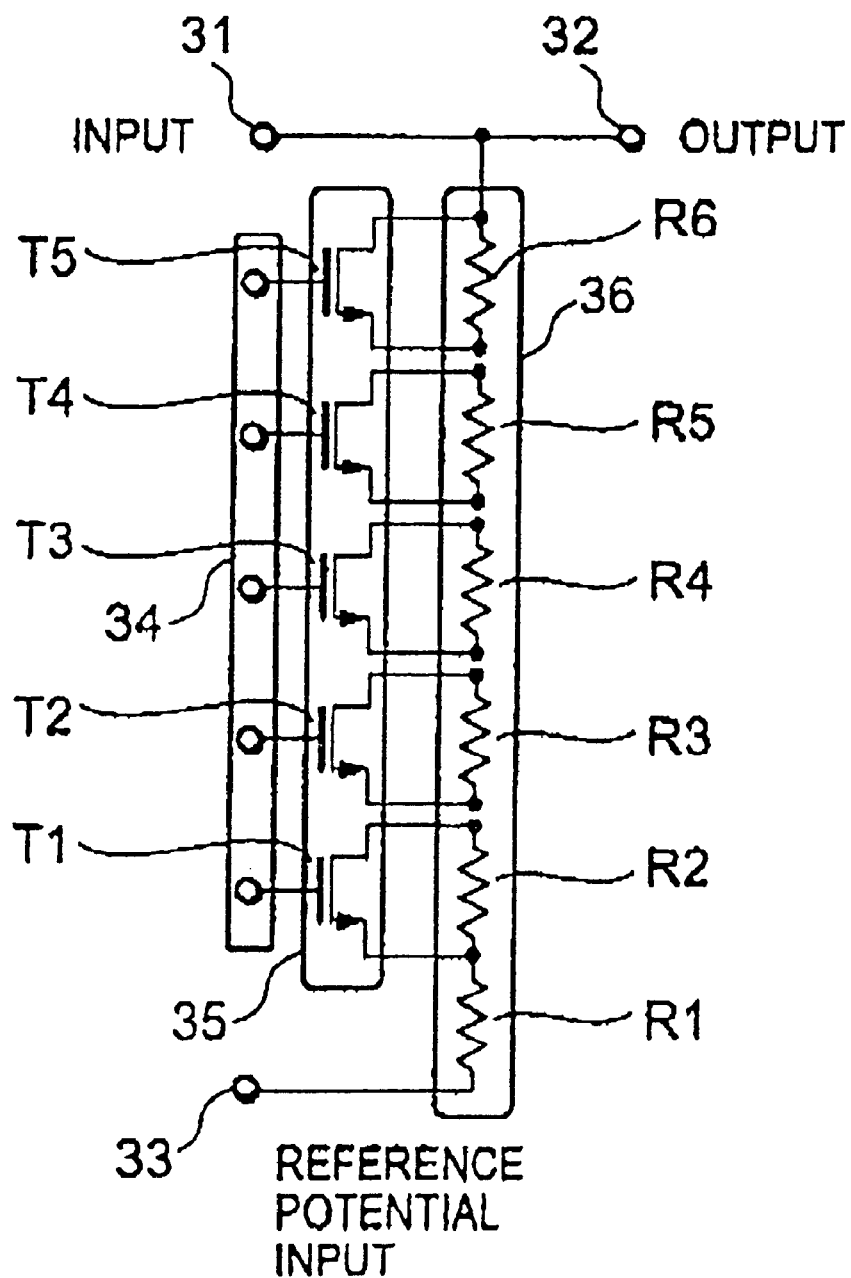
FIG. 3 is a circuit diagram of an attenuator shown in FIG. 1.

FIG. 3 is a circuit diagram of the attenuator shown in FIG. 1.

The attenuator has six resistors R1–R6 (or 36) and five NMOS transistors T1–T5 (or 35). The resistors R1–R6 are connected in series. One end of series connected resistors (one terminal of the resistor R1) is connected to a reference potential input terminal 33. The reference potential input terminal is connected to the reference potential generator 8. The other end of series connected resistors 36 (the other terminal of the resistor R6) is connected to an input terminal 31 and output terminal 32 of the attenuator 3. The input terminal 31 is connected to the band restriction filter 2. The output terminal 32 is connected to the modulator 4.

The NMOS transistors T1–T5 are connected to the resistors R2–R6, respectively. For example, a source and a drain of the transistor T1 are connected to both ends of the resistor R2. Gates of the transistors 35 receive an attenuator control signal output from the attenuator controller 7 shown in FIG. 1. So, the gates of the transistors 35 are called as an attenuator control terminal 34. The attenuator controller 7 is connected to the attenuator control terminal.

The resistors R1–R6 have resistances of 3261 ohms, 804 ohms, 412 ohms, 215 ohms, 115 ohms and 64 ohms, respectively. Since each of the transistors T1–T5 has a resistance, a proportion of the resistances of the resistors R1–R6 is not ideal such as 69:16:8:42:1. The resistances of the resistors R1–R6 are determined by the following steps. First, a current at the output terminal 25 shown in FIG. 2 is measured. (120 uAp-p) Then, the attenuator 3 is in condition of minimum. That is, all of the transistors 35 are OFF states. Under a typical ambient condition, an amplitude voltage of a signal output to the modulator 4 shown in FIG. 1 is calculated as 390 mVp-p. A total value of a sum of six resistances is calculated from the current and the voltage described above. Finally, the total resistance value is divided into proportions of 1%, 2%, 4%, 8% and 16%. Therefore, amplitude of an output of the attenuator 3 can attenuate 1% to 31% with a pitch of 1%.

Figure 4:
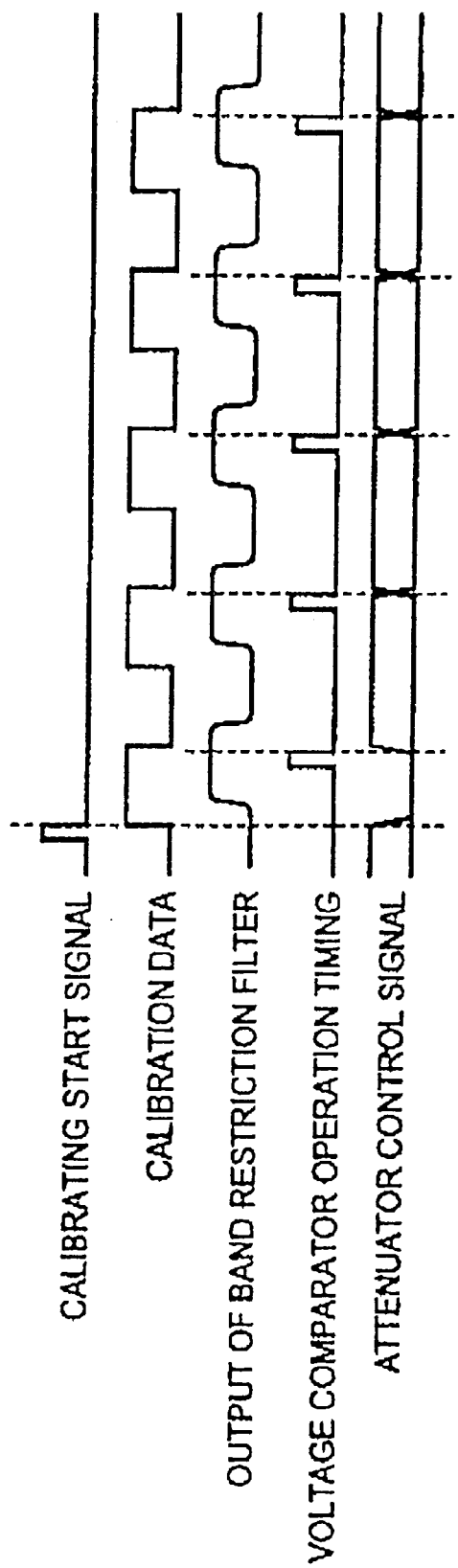
FIG. 4 is a waveform diagram showing signals appeared in the modulation circuit.

FIG. 4 is a waveform diagram showing signals appeared in the modulation circuit during a calibration. When a pulse of a calibrating start signal is input to the modulation calibrating start signal input terminal 11 the calibration operation is started. The data generator 6 outputs calibration data to the band restriction filter 2 in response to the pulse. At that time, the Attenuator controller 7 is reset by a signal output from the controller 5 (not shown in FIG. 1). The attenuator controller 7 generates an attenuator control signal that makes an attenuation of the attenuator 3 minimum by the reset. The calibration data are delayed when it passes through the band restriction filter 2. Therefore, a cycle of the calibration data should have enough length in terms of its delay.

Figure 5:
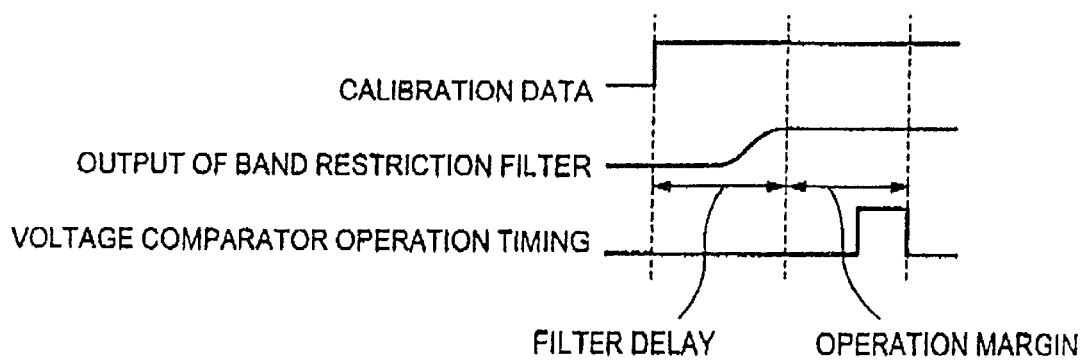
FIG. 5 is a partial enlarged waveform chart shown in FIG. 4.

FIG. 5 is a partial enlarged waveform chart shown in FIG. 4. After the calibration data rises and a filter delay and an operation margin were passed, the controller 5 outputs a voltage comparator operation timing signal to the voltage comparator 10. The voltage comparator 10 compares a voltage of the output signal of the attenuator 3 with an output voltage of the comparing reference potential generator 9 in response to the voltage comparator operation timing signal. One pulse of the voltage comparator operation timing signal is output in a cycle of the calibration data. The output voltage of the comparing reference potential generator 9 is kept in a constant by the reference potential generator independent of the temperature and the process variation. A result of the voltage comparison is sent to the attenuator controller 7. The attenuator controller 7 changes the attenuator control signal in response to the voltage comparison result.

In the first embodiments, the attenuator control signal is changed in six times. That is, the above mentioned steps are repeated in six times. A number of repeat times is equal to a number of the attenuator control signal input terminal plus one.

However, if the attenuator control signal makes transistor T1 ON state and the other transistors T2–T5 Off states at an initial state (the attenuator controller is reset), the attenuator control signal should be changed only in five times. That is, a number of repeat times can be equal to a number of the attenuator control signal input terminal.

In the present embodiment, the attenuator controller 7 changes one signal within five attenuator control signal input terminals during one voltage comparison cycle. That is, one of the NMOS transistors 35 is determined as ON/OFF state in one voltage comparison cycle. An order of the transistor 35 is determined according to an obtained attenuation. In the above procedure, 32 kind of attenuation can be obtained.

As mentioned above, the frequency modulation circuit of the first embodiment of the present invention can keep the output amplitude for the modulator in a constant independent of the power supply voltage and the ambient temperature since the output voltage of the attenuator and the output voltage of the comparing reference potential generator are compared.

The second embodiment of the present invention is hereinafter described.

In the first embodiment, the reference potential generator 8 provides a constant voltage independent of the temperature. In the second embodiment, the reference generator 8 provides a voltage depend on the temperature. Further, in the second embodiment, a modulation factor of the output signal of the modulator 4 is changed depend on the temperature when a DC voltage of the input signal of the modulator 4 is constant. A temperature dependency of the output modulation factor of the modulator 4 is known previously. So, a temperature dependency of the output voltage of the reference potential generator 8 is adjusted for compensating a change of the output modulation factor of the modulator 4. In the second embodiment, a potential difference between the reference potential generator 8 and the comparing reference potential generator 9 is same to the first embodiment and is independent from the temperature.

The modulation factor of the output signal of the modulator 4 has a positive temperature dependency. Further, the output voltage of the reference potential generator 8 has a positive temperature dependency. Since the output voltage of the reference potential generator 8 has a positive temperature dependency, a DC voltage of the attenuator output signal has also a positive temperature dependency.

Figure 6:
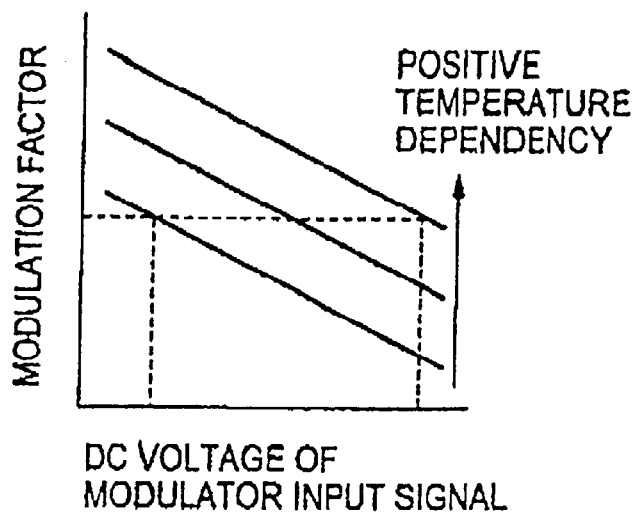
FIG. 6 is a graph showing a temperature dependency of an input signal DC voltage of the modulator according to the second embodiment of the present invention.

FIG. 6 is a graph showing a temperature dependency of an input signal DC voltage of the modulator according to the second embodiment of the present invention In FIG. 6, three solid lines show a relationship between the output modulation factor of the modulator 4 and the DC voltage of the modulator input signal. A lower solid line shows the relationship at a lower temperature. A higher solid line shows the relationship at a higher temperature. As understood from FIG. 6, The DC voltage of modulator input signal should increase depend on the temperature rising for compensating the temperature dependency of the modulation factor.

Figure 7:
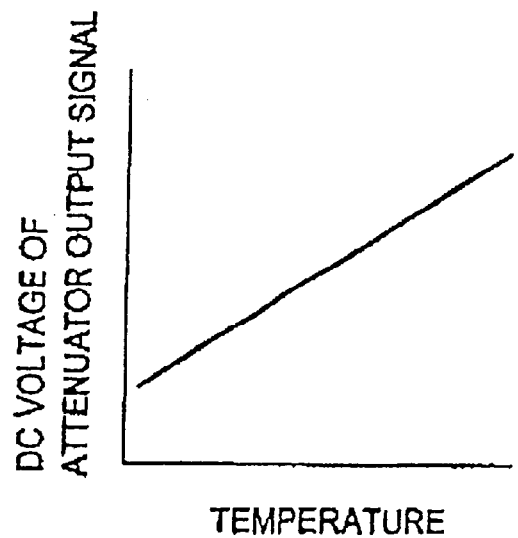
FIG. 7 is a graph showing a temperature dependency of an output signal DC voltage of the attenuator according to the second embodiment of the present invention.

FIG. 7 is a graph showing a temperature dependency of an output signal DC voltage of the attenuator according to the second embodiment. In the case where the reference potential generator 8 has a positive temperature dependency, a DC voltage of the attenuator output signal has also a positive temperature dependency as shown in FIG. 7. Therefore, a change of modulation factor of the modulator 4 depend on the temperature can be compensated. In the case where the modulator 4 has a negative temperature dependency, the reference potential generator 8 should have a negative temperature dependency for compensating the modulation factor of the modulator 4.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention. For example, the explanation of the embodiment of the present invention relates to a frequency modulation. However, the present invention can be adapted to a amplitude modulation.

What is claimed is:

1. A modulation circuit comprising:
    a band restriction filter for receiving modulation data;
    an attenuator connected to the band restriction filter, the attenuator adjusting its attenuation in response to an attenuator control signal;
    a reference voltage generator connected to the attenuator for providing a reference voltage independent of a temperature and a power supply voltage to the attenuator;
    a comparing reference voltage generator connected to the reference voltage generator for providing a comparing reference voltage independent of the temperature and the power supply voltage;
    a modulator connected to the attenuator;
    a voltage comparator connected to the attenuator and the comparing reference voltage generator for comparing the comparing reference voltage with a voltage of an output of the attenuator and generating a comparison signal based on the comparison; and
    an attenuator controller connected to the attenuator and the voltage comparator, the attenuator controller generating the attenuator control signal in response to the comparison signal.

2. A modulation circuit according to claim 1, further comprising:
    a control circuit connected to the voltage comparator, the control circuit receiving a modulation calibrating start signal and generating a voltage comparator operation timing signal; and
    wherein the voltage comparator operates in response to the voltage comparator operation timing signal.

3. A modulation circuit according to claim 2, wherein the controller resets the attenuator controller in response to the modulation calibrating start signal.

4. A modulation circuit according to claim 2, further comprising:
    a data generator connected to the control circuit and the band restriction filter, the data generator generating calibration data in response to the modulation calibrating start signal received through the control circuit.

5. A modulation circuit according to claim 4, wherein the voltage comparator operation timing signal is activated at a timing after the calibration data are activated and a filter delay of the band restriction filter and operation margin are passed.

6. A modulation circuit according to claim 1, wherein the attenuator includes:
    an input terminal connected to the band restriction filter;
    an output terminal connected to the modulator;
    a reference potential input terminal connected to the reference potential generator;
    a plurality of resistors connected in series between the reference potential input terminal and output terminal; and
    a plurality of transistors each of which has a gate connected to the attenuator controller, a source and a drain connected to both ends of a corresponding one of the resistors.

7. A modulation circuit comprising:
    a band restriction filter for receiving modulation data;
    an attenuator connected to the band restriction filter, the attenuator adjusting its attenuation in response to an attenuator control signal, wherein a modulation factor of the output signal of the modulator is changed depend on a temperature when a DC voltage of the input signal of the modulator is constant;
    a reference voltage generator connected to the attenuator for providing a reference voltage depend on the temperature to the attenuator;
    a comparing reference voltage generator connected to the reference voltage generator for providing a comparing reference voltage depend on the temperature;
    a modulator connected to the attenuator;
    a voltage comparator connected to the attenuator and the comparing reference voltage generator for comparing the comparing reference voltage with a voltage of an output of the attenuator and generating a comparison signal based on the comparison; and
    an attenuator controller connected to the attenuator and the voltage comparator, the attenuator controller generating the attenuator control signal in response to the comparison signal.

8. A modulation circuit according to claim 7, further comprising:

a control circuit connected to the voltage comparator, the control circuit receiving a modulation calibrating start signal and generating a voltage comparator operation timing signal; and wherein the voltage comparator operates in response to the voltage comparator operation timing signal.

9. A modulation circuit according to claim 8, wherein the controller resets the attenuator controller in response to the modulation calibrating start signal.

10. A modulation circuit according to claim 8, further comprising:

a data generator connected to the control circuit and the band restriction filter, the data generator generating calibration data in response to the modulation calibrating start signal received through the control circuit.

11. A modulation circuit according to claim 10, wherein the voltage comparator operation timing signal is activated at a timing after the calibration data are activated and a filter delay of the band restriction filter and operation margin are passed.

12. A modulation circuit according to claim 7, wherein the attenuator includes:

an input terminal connected to the band restriction filter;

an output terminal connected to the modulator;

a reference potential input terminal connected to the reference potential generator;

a plurality of resistors connected in series between the reference potential input terminal and output terminal; and a plurality of transistors each of which has a gate connected to the attenuator controller, a source and a drain connected to both ends of a corresponding one of the resistors.

13. A modulation circuit comprising:

a band restriction filter for receiving modulation data;

an attenuator connected to the band restriction filter, the attenuator adjusting its attenuation in response to an attenuator control signal;

a modulator connected to the attenuator, the modulator receiving the attenuated modulation data from the attenuator;

a reference voltage generator connected to the attenuator for providing a reference voltage independent of a temperature and a power supply voltage to the attenuator;

a voltage comparator connected to the attenuator and the reference voltage generator for comparing the reference voltage with a voltage of the attenuated modulation data and generating a comparison signal based on the comparison; and an attenuator controller connected to the attenuator and the voltage comparator, the attenuator controller generating the attenuator control signal in response to the comparison signal.

14. A modulation circuit according to claim 13, wherein the reference voltage generator has a comparing reference voltage generator for providing a comparing reference voltage having a predetermined voltage difference with the reference voltage, and wherein the voltage comparator compares the comparing reference voltage with the voltage of the attenuated modulation data.

15. A modulation circuit according to claim 13, further comprising:

a control circuit connected to the voltage comparator, the control circuit receiving a modulation calibrating start signal and generating a voltage comparator operation timing signal; and wherein the voltage comparator operates in response to the voltage comparator operation timing signal.

16. A modulation circuit according to claim 15, wherein the controller resets the attenuator controller in response to the modulation calibrating start signal.

17. A modulation circuit according to claim 15, further comprising:

a data generator connected to the control circuit and the band restriction filter, the data generator generating calibration data in response to the modulation calibrating start signal received through the control circuit.

18. A modulation circuit according to claim 17, wherein the voltage comparator operation timing signal is activated at a timing after the calibration data are activated and a filter delay of the band restriction filter and operation margin are passed.

19. A modulation circuit according to claim 13, wherein the attenuator includes:

an input terminal connected to the band restriction filter;

an output terminal connected to the modulator;

a reference potential input terminal connected to the reference potential generator;

a plurality of resistors connected in series between the reference potential input terminal and output terminal; and a plurality of transistors each of which has a gate connected to the attenuator controller, a source and a drain connected to both ends of a corresponding one of the resistors.

* * * * *